(12) United States Patent
Kang

(10) Patent No.: US 6,858,086 B2
(45) Date of Patent: Feb. 22, 2005

(54) TENSION MASK ASSEMBLY FOR USE IN VACUUM DEPOSITION OF THIN FILM OF ORGANIC ELECTROLUMINESCENT DEVICE

(75) Inventor: Chang Ho Kang, Yangsan (KR)

(73) Assignee: Samsung Oled Co., Ltd., Ulsan-si (KR)

( * ) Notice: Subject to any disclaimer, the term of this patent is extended or adjusted under 35 U.S.C. 154(b) by 247 days.

(21) Appl. No.: 10/223,471

(22) Filed: Aug. 20, 2002

(65) Prior Publication Data
US 2003/0101932 A1 Jun. 5, 2003

(30) Foreign Application Priority Data
Dec. 5, 2001 (KR) .......................... 2001-76490

(51) Int. Cl.[7] .................... C23C 16/00; C23C 16/04; C23C 14/00; C23C 14/04
(52) U.S. Cl. ................ 118/720; 118/504; 204/298.11
(58) Field of Search .................... 118/720, 721, 118/504, 505; 204/298.11

(56) References Cited

U.S. PATENT DOCUMENTS

| | | | |
|---|---|---|---|
| 3,241,519 A | 3/1966 | Lloyd | 118/49 |
| 3,647,533 A * | 3/1972 | Hicks | 427/99 |
| 4,278,528 A * | 7/1981 | Kuehnle et al. | 204/298.11 |
| 6,146,489 A * | 11/2000 | Wirth | 156/280 |
| 6,475,287 B1 * | 11/2002 | Clark | 118/721 |
| 6,611,089 B2 * | 8/2003 | Kim et al. | 313/407 |
| 6,729,927 B2 * | 5/2004 | Stagnitto et al. | 445/47 |
| 2002/0025406 A1 | 2/2002 | Kitazume | 428/136 |
| 2002/0062785 A1 * | 5/2002 | Kim et al. | 118/504 |
| 2003/0101932 A1 * | 6/2003 | Kang | 118/504 |
| 2003/0221613 A1 * | 12/2003 | Kang et al. | 118/504 |
| 2003/0221614 A1 * | 12/2003 | Kang et al. | 118/504 |

FOREIGN PATENT DOCUMENTS

| | | |
|---|---|---|
| EP | 1 209 522 | 5/2002 |
| EP | 1 229 144 | 8/2002 |
| JP | 2002-235165 | 8/2002 |

* cited by examiner

Primary Examiner—Jeffrie R. Lund
(74) Attorney, Agent, or Firm—Staas & Halsey LLP

(57) ABSTRACT

A mask frame assembly used in vacuum deposition of thin films of an organic electroluminescent device. The mask frame assembly includes a frame having an opening and at least two unit masks which each have at least one unit masking pattern portion in the direction of the unit mask and two edges which are fixed to the frame under tension.

17 Claims, 9 Drawing Sheets

TENSION MASK ASSEMBLY FOR USE IN VACUUM DEPOSITION OF THIN FILM OF ORGANIC ELECTROLUMINESCENT DEVICE

CROSS-REFERENCE TO RELATED APPLICATIONS

This application claims the benefit of Korean Application No. 2001-76490, filed Dec. 5, 2001, in the Korean Industrial Property Office, the disclosure of which is incorporated herein by reference.

BACKGROUND OF THE INVENTION

1. Field of the Invention

The present invention relates to a metal mask, and more particularly, to a mask frame assembly used in deposition of thin films of an organic electroluminescent device.

2. Description of the Related Art

Recently, electroluminescent (EL) devices regarded as self-luminous type display devices have been receiving a lot of attention as a next-generation display device due to the advantages of a wide viewing angle and good contrast and rapid response characteristics.

EL devices are classified into inorganic EL devices and organic EL devices depending upon the material of an emissive layer. Organic EL devices can realize color display and have better luminance and response characteristics than inorganic EL devices.

An organic EL device includes a series of first electrodes formed as a predetermined pattern on a transparent insulating substrate, an organic emissive layer formed on the transparent insulating substrate by vacuum deposition, and a series of second electrodes formed on the organic emissive layer to act as a cathode electrode intersecting the first electrode layers.

In the manufacture of an organic EL device having such a structure as described above, the first electrodes are formed of indium thin oxide (ITO). In patterning an ITO layer into the first electrodes, the ITO layer is wet etched in a $FeCl_2$ containing etchant. However, when this photolithography method is applied to etch the second electrodes, liquid permeates into the interface between the organic emissive layer and the second electrodes while the resist used is stripped off and the second electrodes are etched, thereby degrading the performance and lifetime characteristics of the organic EL device.

To address these problems, methods of deposition of an organic luminescent material used as an organic emissive layer and second electrodes have been suggested.

In the manufacture of an organic EL device using these methods, first electrodes of ITO are formed on a transparent insulating substrate as a striped pattern by photolithography. An organic emissive layer is deposited on the transparent insulating substrate where the first electrodes have been formed, and a mask pattern that matches a desired pattern of second electrodes is placed on the organic emissive layer, and a second electrode material is deposited on the transparent substrate.

Korea Laid-open Patent Publication No. 2000-60589 discloses a mask used in deposition of an organic emissive layer or a cathode (second) electrode, an organic EL device manufactured using the mask, and a method of manufacturing the organic EL device. This mask includes a series of long slits spaced a predetermined distance apart in its main thin plate.

Korea Laid-open Patent Publication No. 1998-71583 discloses a mask of metal thin plate having a slit portion and a bridge portion in a mesh pattern.

Japanese Laid-open Patent Publication No. 2000-12238 discloses a mask having an electrode mask portion and a pair of electrode pad mask portions. The electrode mask portion includes a masking portion having a plurality of strips arranged parallel to each other with a width, which is substantially equal to a cathode (second) electrode gap, and a connecting portion which connects the strips at their both ends.

The conventional masks described above include long striped slits in the metal thin plate. Therefore, although the edges of the metal thin plate are supported under tension by a frame, the long slits sag away from a substrate by the weight of the mask. This problem becomes serious as the size of the substrate increases. In addition, thermal expansion of the mask during deposition of the cathode facilitates the sagging of the slits by their weight.

An example of a mask applied to produce organic EL devices on a large scale is illustrated in FIG. 1. The mask of FIG. 1 includes a number of unit masking pattern portions 12 for each organic EL device substrate in a thin metal plate 11 and is supported under tension by a frame 20.

This conventional mask 10 has a relatively large size for large scale production, so the problem of sagging by its own weight becomes serious even when uniform tension is applied to each side of the mask to fix it to the rectangular frame 20. In welding the large-sized thin metal plate to the frame 20, the width of each slit 12a of the unit masking pattern portions 12 should be maintained within a predetermined tolerance range. As tension is applied to each side of the mask 10 to prevent the problem of strip sagging, the pitch of the slit in each unit masking pattern portion 12 is distorted beyond a predetermined tolerance range. In particular, as the slits of a particular unit masking pattern portion of the mask 10 are distorted, the force of the deformation is transferred to the slits of neighboring unit masking pattern portions and thus distorts the neighboring slits. The result is a shadow effect of the mask 10 in deposition of an organic layer or cathode so that the resulting organic layer or cathode pattern is beyond a predetermined tolerance range. This shadow effect is more serious in the traverse direction of the slits 12a of the mask 10.

The distortion of each unit masking pattern portion 12 increases variations in total pitch due to the displacement of unit electrode patterns on the substrate with respect to the original pattern of each unit masking pattern portion 12, thereby disabling accurate deposition of red, blue, and green organic layers on the separate unit electrode patterns of the substrate. In addition, pitch and total pitch adjustment of the unit masking pattern portions formed in a large-sized thin metal plate is possible in only a restricted area, which limits the size of the mask 10.

When tension is applied to each side of a single mask 10 to fix it to a frame 20, side support bars 21 of the frame 20 are curved inwards and upper and lower support bars 22 of the frame 20 are curved outwards by the tension, as shown in FIG. 2. Alternatively, as illustrated in FIG. 3, the side support bars 21 are curved outwards and the upper and lower support bars 22 of the frame 20 are curved inwards by the tension.

Although uniform tension is applied to weld the mask 10 to the frame, the distortion of the mask and displacement of the unit electrode patterns formed on a substrate to the mask patterns make total pitch adjustment difficult.

Japanese Laid-open Patent Publication No. 2001-247961 discloses a mask to eliminate the creeping of strips due to thermal expansion of the mask, which are separated by slits. This mask is used in formation of a patterned layer on a substrate by deposition and includes a mask portion with a number of partitions defining separate first openings and a screen portion with a number of second openings of a smaller size than the first openings. The screen portion includes a magnetic material and is arranged on the mask portion such that the second openings are aligned over the respective first openings.

Japanese Laid-open Patent Publication No. 2001-273979 discloses the structure of a magnetic mask. Japanese Laid-open Patent Publication No. 2001-254169 discloses a deposition mask having an affinity for a target substrate and having a fine pattern portion supported by ribs.

Although the conventional masks described above are supported by the frame and are formed of a magnetic material to give a magnetic affinity for a target substrate, the inherent problems, such as variations in strip pitch due to the weight and the tensile strain of the mask, damage of the organic layer in moving and handling the mask due to increased attraction to the glass substrate, and total pitch variations due to internal stress of the mask and frame occur.

SUMMARY OF THE INVENTION

Accordingly, it is an object of the present invention to provide a mask frame assembly used in vacuum deposition of thin films of an organic electroluminescent (EL) device, in which variations in pattern width as a result of an increase in mask size can be reduced, the total pitch of unit masks can be easily adjusted, and additional variations in total pitch due to external or internal stress of the mask and frame can be minimized.

It is another object of the present invention to provide a mask frame assembly used in vacuum deposition of thin films of an organic EL device, which is constructed of a number of unit masks, so that the size of the mask can be increased without adverse effects.

It is still another object of the present invention to provide a mask frame assembly used in vacuum deposition of thin films of an organic EL device, in which the pitch of strips in a traverse direction of unit masks can be finely adjusted, thereby solving problems associated with total pitch variations of the mask.

Additional objects and advantages of the invention will be set forth in part in the description which follows and, in part, will be obvious from the description, or may be learned by practice of the invention.

The foregoing and other objects of the present invention are achieved by providing a mask frame assembly used in vacuum deposition of thin films of an organic EL device, comprising: a frame having an opening; and at least two unit masks which each have at least one unit masking pattern portion in the direction of the unit mask and two edges which are fixed to the frame under tension.

In an embodiment of the present invention, the at least two unit masks are formed as strips and are fixed to the frame such that they does not physically contact each other. Further, the frame comprises: support members arranged parallel to each other; and elastic members which connect the edges of the support members.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
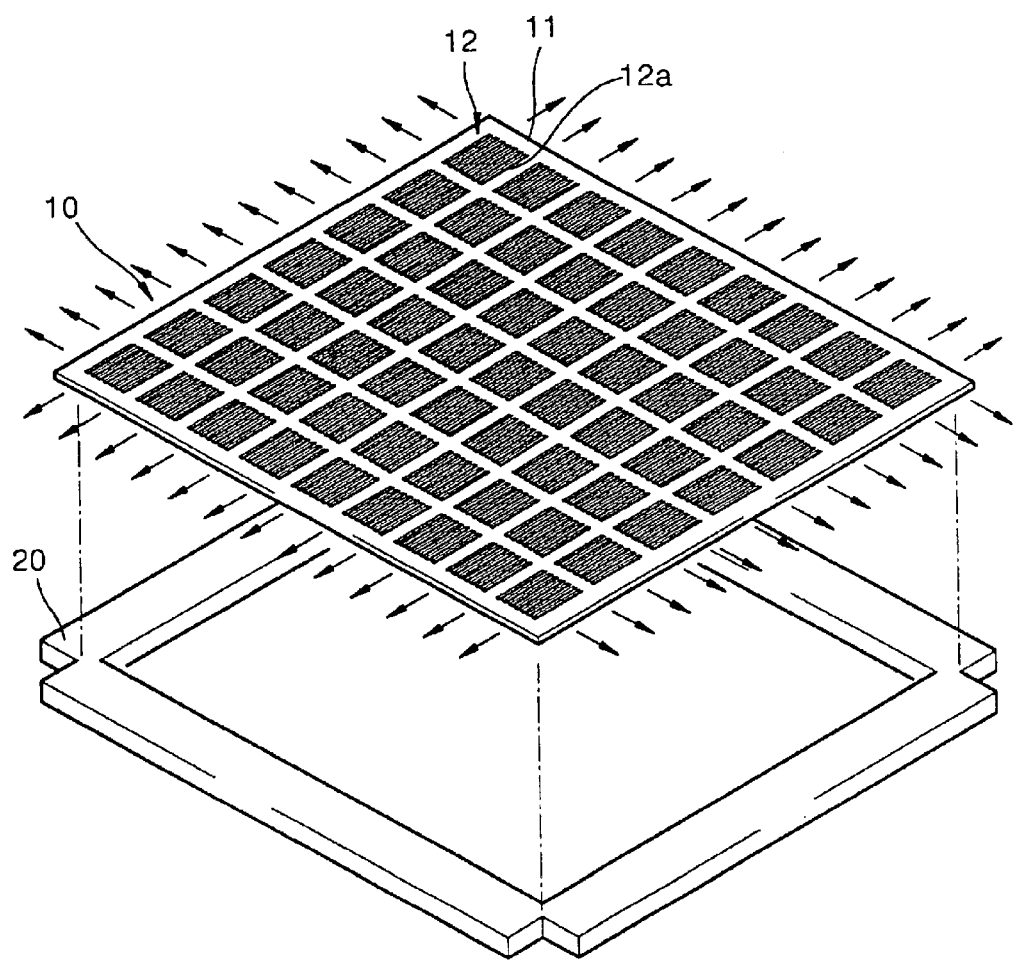
FIG. 1 is an exploded perspective view of a conventional mask frame assembly used in vacuum deposition of thin films of an organic electroluminescent (EL) device.
Figure 2:
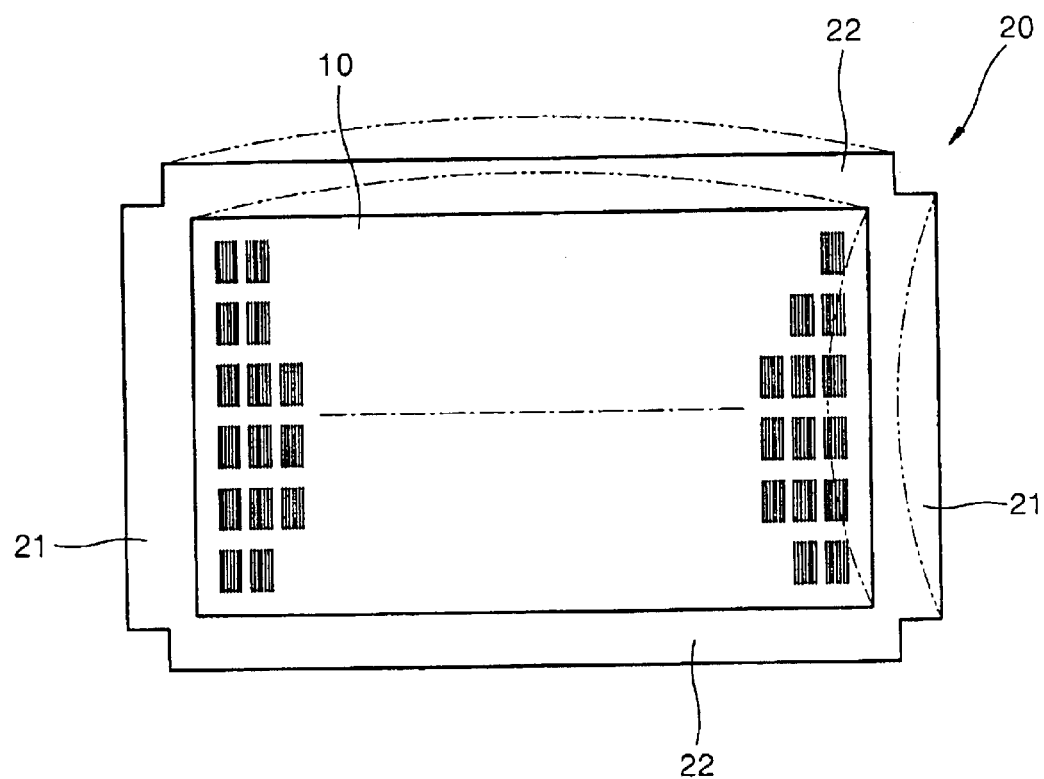
FIGS. 2 and 3 are plan views of conventional mask frame assemblies.
Figure 3:
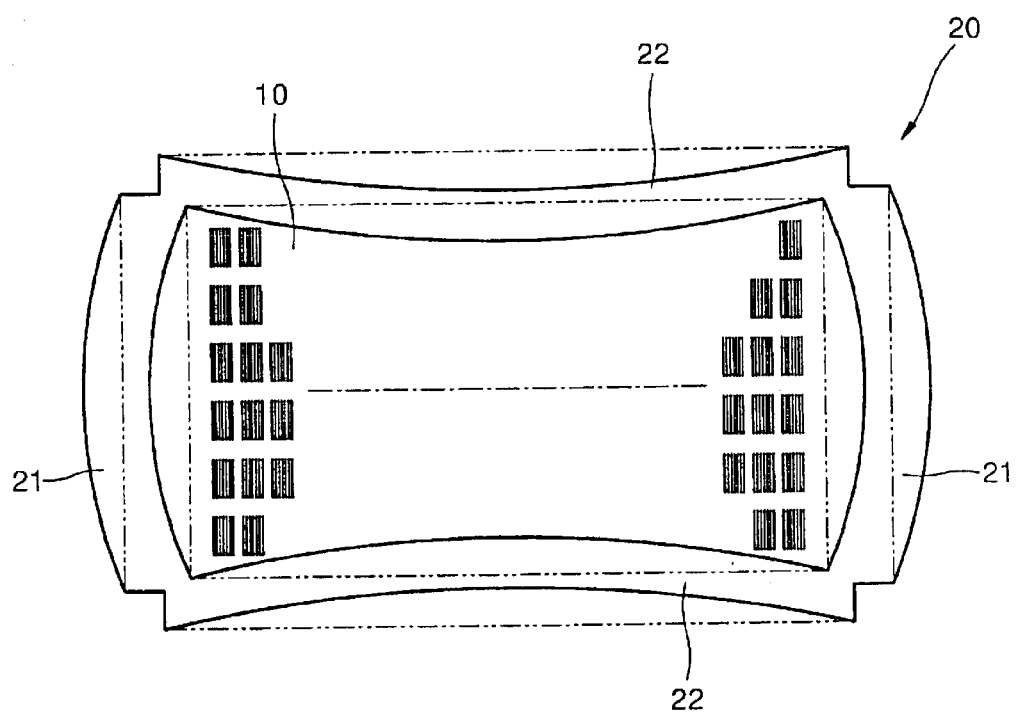

Reference will now be made in detail to the embodiments of the present invention, examples of which are illustrated in the accompanying drawings, wherein like reference numerals refer to like elements throughout.

Figure 4:
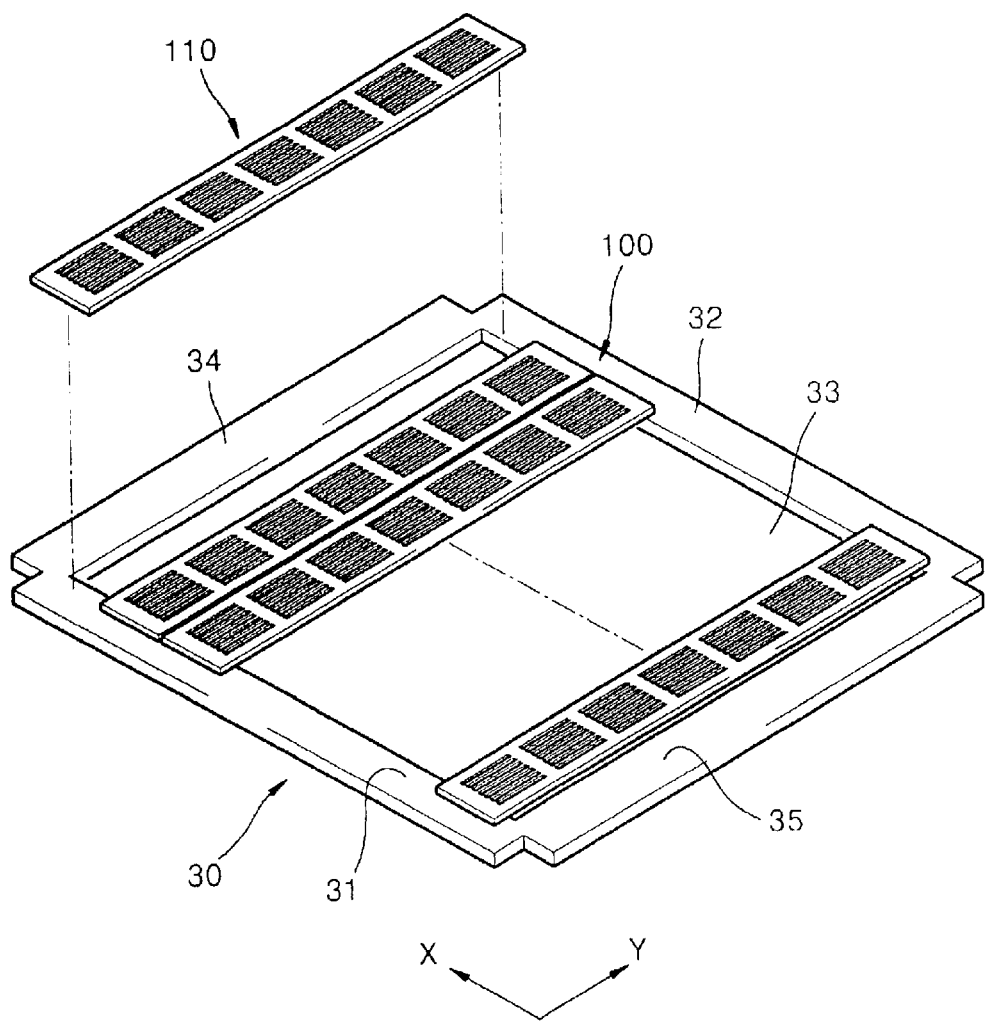
FIG. 4 is an exploded perspective view of a mask frame assembly used in vacuum deposition of thin films of an organic EL device according to the present invention.

An embodiment of a mask frame assembly used in vacuum deposition of thin films of an organic electroluminescent (EL) device according to the present invention is illustrated in FIG. 4. Referring to FIG. 4, the mask frame assembly includes a frame 30 and a mask 100 whose two edges are supported under tension by the frame 30.

The frame 30 includes support members 31 and 32, which are arranged parallel to each other, and elastic members 34 and 35 connected to the edges of the support members 31 and 32 to define a rectangular opening 33. The frame 30 should be rigid enough to apply tension to a unit mask 110 described infra. Any structure can be applied to the frame 30 as long as it does not cause interference between a target substrate and the mask 100.

Figure 5:
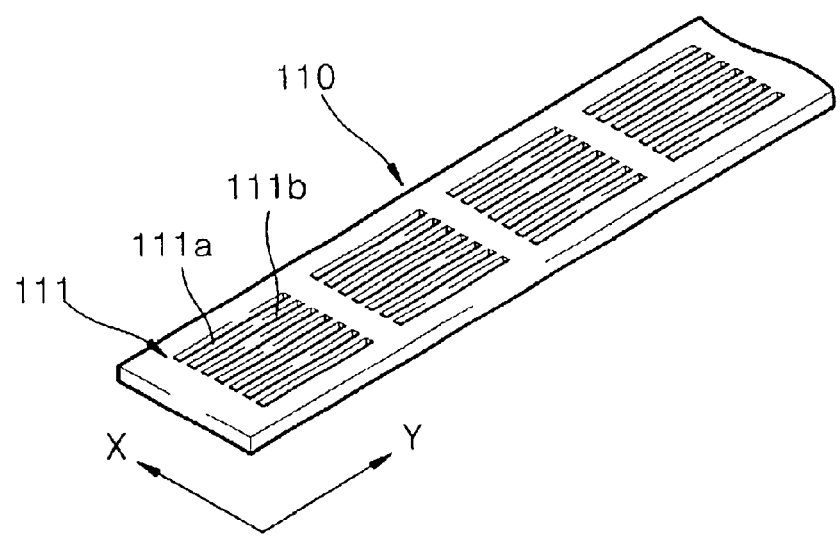
FIG. 5 is a perspective view of a unit mask of the mask frame assembly according to an embodiment of the present invention.

The mask 100 includes a number of unit masks 110. Two edges of each unit mask are supported under tension by the frame 30. As illustrated in FIGS. 4 and 5, each unit mask 110 is formed of a strip of a thin plate and includes unit masking pattern portions 111 at predetermined intervals along the direction of the thin plate. The shape of the unit mask 110 is not limited to the strip.

Each unit masking pattern portion 111 includes strips 111a formed in the thin plate parallel to each other in the direction of the unit mask 110 and long slits 111b defined by the strips 111a. Here, the length of the slits 111b is determined to be shorter than a predetermined length by consideration of the Poisson's contraction caused by the tension exerted on the unit mask 100 supported by the frame 30. The width of the slits 110b is determined to be wider than a predetermined width. The unit masking pattern portion 111 may have a predetermined opening pattern.

Figure 6:
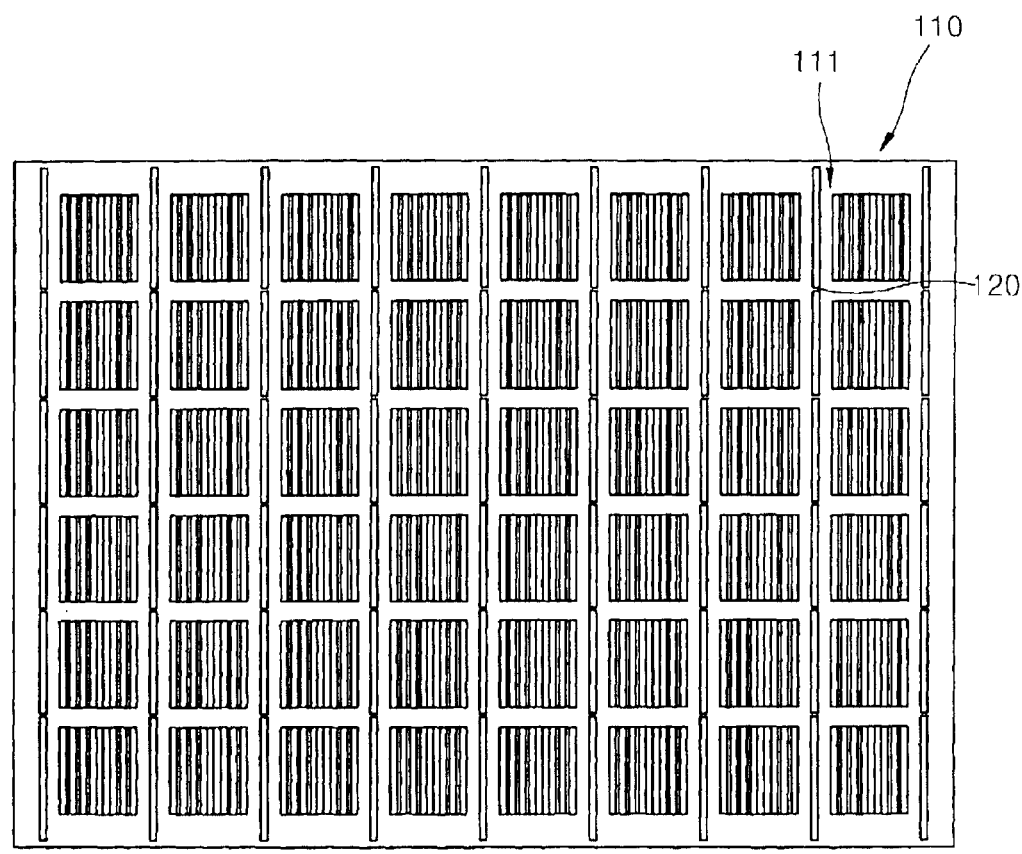
FIG. 6 is a plan view of an original plate to illustrate the manufacture of unit masks of the mask frame assembly according to an embodiment of the present invention.
Figure 7:
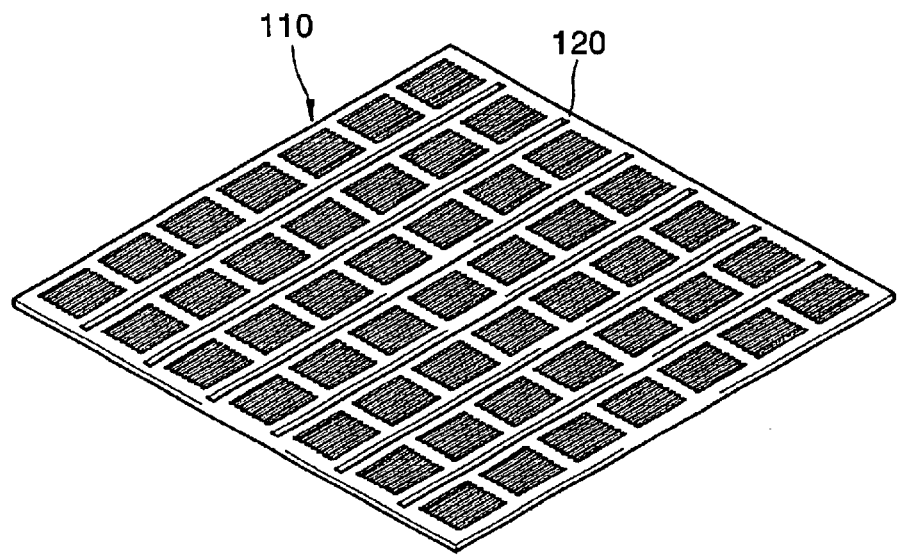
FIG. 7 is a plan view of another original plate to illustrate the manufacture of unit masks of the mask frame assembly according to the present invention.

The unit masks 110 described above are formed by fully or half etching an original metal plate such that at least one connecting portion 120 between adjacent unit masks, as shown in FIG. 6, remains, or such that a pair of connecting portions 120 remain at both ends of the individual unit masks. After the etching, unit masks within an allowable error range are selected for use. The unit masks 110 whose unit masking pattern portions have a pattern width within a predetermined error range are selected and mounted into the frame 30. As the unit masking pattern portions 111 of the unit masks 110 fixed to the frame 30 have a pattern width within the predetermined error range, the pattern width is more uniform compared to a conventional single-body metal plate mask having a pattern.

Figure 8:
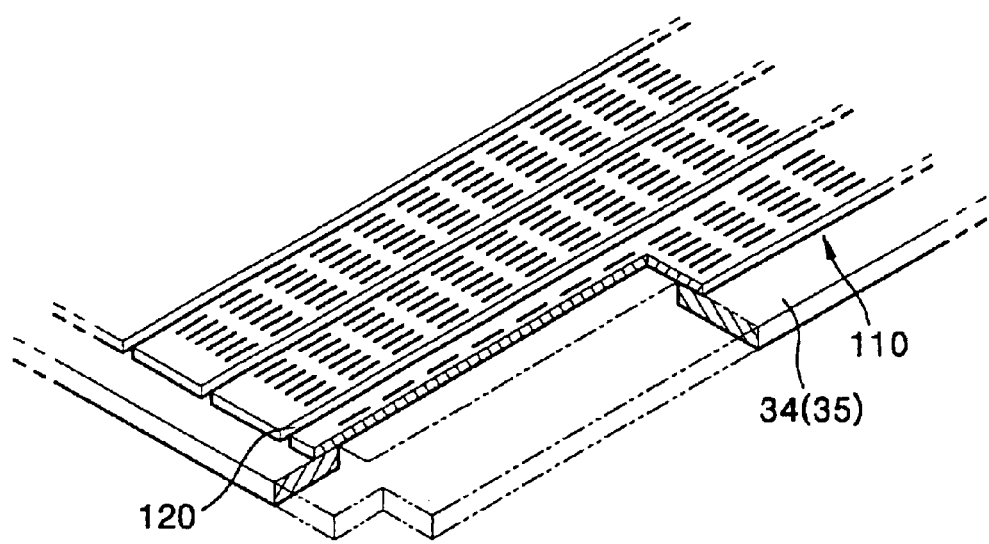
FIG. 8 is a partially exploded perspective view illustrating assembling of a frame and unit masks formed using the original plate of FIG. 7.

In fixing the unit masks 110 to the support members 31 and 32 of the frame 30, each unit mask 110 is stretched in Y- and X-directions to overlap the support members 31 and 32 and welded to the support members 31 and 32. Here, the tension is most strongly exerted on the unit masks 110 in the Y-direction, which minimizes distortion of the strips of the unit masking pattern portions 111. When welding the unit masks 110 to the frame 30, the unit mask adjacent to the elastic member 34 (35) may be welded to the edge of the elastic member 34 (35) in the longitudinal direction, as shown in FIG. 8, not to form a gap between the elastic member 34 (35) and the adjacent unit mask.

Welding may be performed by, but not limited to, spot welding or YAG laser welding. Preferably, the gap between each of the unit masks 110 is maintained in the range of 0.1–1 mm in terms of total pitch adjustment of the mask 100.

Use of the mask frame assembly according to the present invention having the structure described above in vacuum deposition of thin films of an organic EL device will be described in greater detail with reference to FIG. 4 and a thin film deposition apparatus of FIG. 9.

Figure 9:
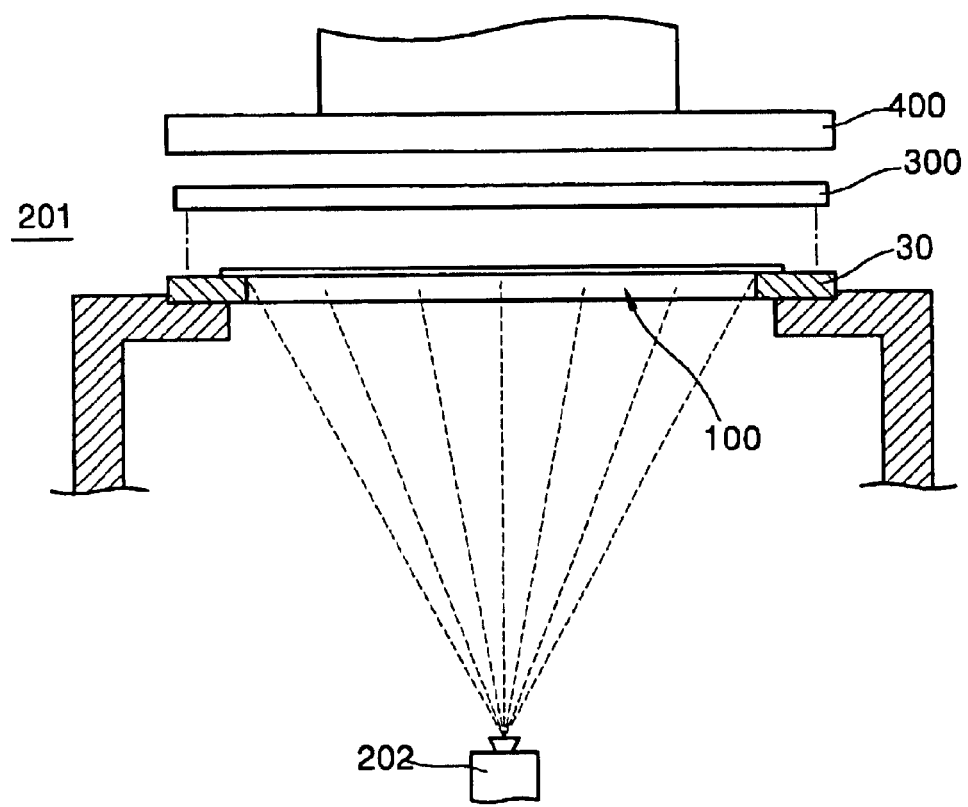
FIG. 9 is a sectional view of an apparatus used in deposition of an organic layer on a substrate.

Referring to FIG. 9, to deposit thin films of an organic EL device, such as red, green, and blue organic layers or a cathode layer using the mask 100, the mask frame assembly is initially mounted into a vacuum chamber 201 to face a crucible 202, and a substrate 300 on which the thin films are to be formed is loaded above the mask frame assembly. A magnet unit 400 placed above the substrate 300 is operated to move the mask 100 supposed by a frame 30 toward the substrate 300.

In this state, the crucible 202 is heated to evaporate an organic layer or cathode precursor contained therein so that the organic layer or cathode layer is deposited on the substrate 300. During this process, the mask 100 sags by its own weight, and the strips 111a of the unit masking pattern portions 111 placed close to the substrate 300 are thermally deformed. However, the mask 100 comprises a number of unit masks 110 so that serious localized deformation of the mask 100 and pattern distortion can be prevented. In other words, each unit mask 110 is stretched in the direction of the strips 111a, i.e., Y-direction, and then fixed to the frame 30, so that the tension exerted on every unit mask 110 is uniform and thus there is no localized deformation of the mask 100.

The mask frame assembly according to the present invention having the structure described above can eliminate problems associated with fine pattern formation in a conventional single-body metal plate mask including a number of unit masking pattern portions. In addition, according to the present invention, since a relatively small tension is exerted in the traverse direction of the unit mask, i.e., X-direction, distortion of the unit masking pattern portions is prevented.

In a single-body large-sized mask having a number of unit masking pattern portions, the total pitch of the unit masking pattern portions can be adjusted by merely the force applied to stretch the entire large-sized mask. In the mask 100 according to the present invention, it is easy to adjust the total pitch of the mask, which reflects the accumulated displacement of all unit electrode patterns formed on the substrate to the mask patterns, because the mask 100 comprises a number of unit masks 110. In addition, the unit masks can be separately mounted unto the frame so that the total pitch can be adjusted for each unit mask.

In the mask frame assembly according to the present invention used in vacuum deposition of thin films of an organic EL device, which has the configuration described above, the mask to be mounted into the frame is divided into a number of unit masks and tension is exerted on each of the unit masks. As a result, the total pitch of the mask can be adjusted within an error range of ±2 μm and the pattern width can be adjusted within a tolerance range of ±5 μm. The structure of the mask frame assembly enables formation of a large-sized mask.

Although a few embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A mask frame assembly for use in vacuum deposition of thin films of an organic electroluminescent device, the mask frame assembly comprising:

a frame having an opening; and at least two unit masks, each unit mask comprising:

at least one unit masking pattern portion for the deposition of the thin films, the at least one unit masking pattern portion formed in a length direction of the unit mask, and two edges which are fixed to the frame under tension applied in the length direction, wherein the at least two unit masks are spaced apart from each other in the opening of the frame.

2. The mask frame assembly according to claim 1, wherein the at least two unit masks are formed by strips in the length direction.

3. The mask frame assembly according to claim 1, wherein the frame comprises:

support members arranged parallel to each other; and elastic members which connect the edges of said support members.

4. The mask frame assembly according to claim 3, wherein the support members and the elastic members are formed as a single body.

5. The mask frame assembly according to claim 1, wherein said at least one unit masking pattern portion comprises slits defined by stripe extending in the direction of the unit masking pattern portion parallel to each other.

6. The mask frame assembly according to claim 5, wherein said strips of said at least two masking pattern portions have non-uniform widths in consideration of tension to be exerted thereon.

7. The mask frame assembly according to claim 1, wherein said at least one unit masking pattern portion comprises openings in a predetermined pattern.

8. The mask frame assembly according to claim 1, wherein the at least two unit masks are joined at opposite ends of the unit masks by a connecting portion which maintains the unit masks transversely spaced apart from each other in the opening of the frame.

9. A mask frame assembly for use in vacuum deposition of thin films of an organic electroluminescent device, the mask frame assembly comprising:

a frame having an opening; and at least two unit masks, each unit mask having two opposing edges fixed to said frame under tension, wherein adjacent unit masks are spaced apart within the opening of the frame so as to have a gap in a predetermined interval between the adjacent unit masks.

10. The mask frame assembly according to claim 9, wherein each said unit mask has at least one pattern portion in a direction of the unit mask.

11. The mask frame assembly according to claim 9, wherein each said unit mask is welded to said frame by spot welding.

12. The mask frame assembly according to claim 9, wherein each said unit mask is welded to said frame by YAG laser welding.

13. The mask frame assembly according to claim 9, wherein each said unit mask has at least one masking pattern including strips in a direction of the length of said unit mask such that the length of said strips is determined in consideration of Poisson's contraction caused by the tension exerted on each said unit mask.

14. The mask frame assembly according to claim 9, wherein a gap between the adjacent masks is maintained in a range of 0.01–1 mm.

15. The mask frame assembly according to claim 9, wherein the adjacent unit masks are joined at opposite ends of the unit masks by a connecting portion which spaces the adjacent unit masks apart.

16. A mask frame assembly for use in vacuum deposition of thin films of an organic electroluminescent device, the mask frame assembly comprising:

a frame having a rectangular opening; and at least two unit masks for the deposition of the thin films, each unit mask having two opposing edges fixed to the frame under tension applied in a length direction of each unit mask, wherein portions of the frame, to which each unit mask is fixed, are parallel to each other.

17. The mask frame assembly according to claim 16, wherein the at least two unit masks are formed by strips in the length direction and are fixed to the frame such that the unit masks do not physically contact each other.

* * * * *

UNITED STATES PATENT AND TRADEMARK OFFICE
CERTIFICATE OF CORRECTION

PATENT NO. : 6,858,086 B2
DATED : February 22, 2005
INVENTOR(S) : Chang-ho Kang

It is certified that error appears in the above-identified patent and that said Letters Patent is hereby corrected as shown below:

Column 6,
Line 54, change "stripe" to -- strips --.

Signed and Sealed this

Sixteenth Day of August, 2005

JON W. DUDAS
*Director of the United States Patent and Trademark Office*